(12) United States Patent
Nimityongskul et al.

(10) Patent No.: US 12,207,406 B2
(45) Date of Patent: Jan. 21, 2025

(54) LIGHT MODULE APERTURE FOR PRINTED CIRCUIT BOARD INTEGRATION

(71) Applicant: Electronic Theatre Controls, Inc., Middleton, WI (US)

(72) Inventors: Sunya Nimityongskul, Middleton, WI (US); Brian Zelle, Middleton, WI (US)

(73) Assignee: Electronic Theatre Controls, Inc., Middleton, WI (US)

( * ) Notice: Subject to any disclaimer, the term of this patent is extended or adjusted under 35 U.S.C. 154(b) by 235 days.

(21) Appl. No.: 17/764,398

(22) PCT Filed: Nov. 24, 2020

(86) PCT No.: PCT/US2020/062107
§ 371 (c)(1),
(2) Date: Mar. 28, 2022

(87) PCT Pub. No.: WO2021/108463
PCT Pub. Date: Jun. 3, 2021

(65) Prior Publication Data
US 2022/0369459 A1    Nov. 17, 2022

Related U.S. Application Data

(60) Provisional application No. 62/939,833, filed on Nov. 25, 2019.

(51) Int. Cl.
*H05K 1/14* (2006.01)
*F21V 23/00* (2015.01)
(Continued)

(52) U.S. Cl.
CPC ............ *H05K 1/141* (2013.01); *F21V 23/005* (2013.01); *F21W 2131/406* (2013.01);
(Continued)

(58) Field of Classification Search
CPC ......... H05K 1/141; H05K 2201/09063; H05K 2201/10106; H05K 3/368
See application file for complete search history.

(56) References Cited

U.S. PATENT DOCUMENTS 5,293,068 A *  3/1994  Kohno ............. H01L 23/49531
                                          257/676
6,253,350 B1 *  6/2001  Durham ............ G01R 31/3004
                                          714/823
(Continued)

FOREIGN PATENT DOCUMENTS

DE    102010043220 A1    5/2012
DE    202016102537 U1    5/2016
WO    2010/060420 A1    6/2010

OTHER PUBLICATIONS

International Search Report for corresponding International Application No. PCT/US2020/062107, dated Mar. 15, 2021.

*Primary Examiner* — Paresh Paghadal
(74) *Attorney, Agent, or Firm* — Michael Best & Friedrich LLP (57) ABSTRACT

A light fixture for producing a light output. The light fixture includes a control printed circuit board and a light module printed circuit board. The control printed circuit board includes an aperture and a first number of printed circuit board layers. The control printed circuit board has a first surface area. The light module printed circuit board is configured to electrically connect to the control printed circuit board at the aperture to allow light from the light module printed circuit board to pass through the aperture. The light module printed circuit board includes a second number of printed circuit board layers. The light module printed circuit board has a second surface area. The first number of printed circuit board layers is greater than the (Continued)

second number of printed circuit board layers. The first surface area is larger than the second surface area.

19 Claims, 9 Drawing Sheets

(51) Int. Cl.
  *F21W 131/406* (2006.01)
  *F21Y 115/10* (2016.01)
(52) U.S. Cl.
  CPC . *F21Y 2115/10* (2016.08); *H05K 2201/09063* (2013.01); *H05K 2201/10106* (2013.01)

(56) References Cited

U.S. PATENT DOCUMENTS

| | | | | |
|---|---|---|---|---|
| 7,688,875 | B2* | 3/2010 | Uchida | H01S 5/423 372/50.12 |
| 2002/0189083 | A1* | 12/2002 | Matsumoto | H05K 3/303 336/200 |
| 2003/0116769 | A1* | 6/2003 | Song | H01L 25/0753 257/E33.072 |
| 2007/0296533 | A1* | 12/2007 | Springett | H01F 27/2804 336/200 |
| 2008/0278954 | A1* | 11/2008 | Speier | H05K 1/141 257/E21.511 |
| 2009/0090926 | A1* | 4/2009 | Wang | H01L 25/167 257/E33.056 |
| 2009/0267794 | A1* | 10/2009 | Chang | G09F 9/302 340/907 |
| 2010/0110659 | A1* | 5/2010 | Nakajima | H05K 1/183 438/26 |
| 2014/0177220 | A1* | 6/2014 | Miyata | H05K 3/32 362/235 |
| 2015/0198314 | A1* | 7/2015 | Frederiksen | F21V 19/0015 362/382 |
| 2015/0276144 | A1* | 10/2015 | Tudhope | F21V 5/10 29/832 |
| 2019/0008045 | A1* | 1/2019 | Iedema | H05K 1/141 |
| 2019/0177220 | A1* | 6/2019 | Sant | C04B 7/367 |
| 2020/0296844 | A1* | 9/2020 | Lin | F24C 7/086 |

* cited by examiner

LIGHT MODULE APERTURE FOR PRINTED CIRCUIT BOARD INTEGRATION

RELATED APPLICATIONS

This application claims the benefit of U.S. Provisional Patent Application No. 62/939,833, filed Nov. 25, 2019, the entire content of which is hereby incorporated by reference.

FIELD

Embodiments described herein relate to a connection between a control printed circuit board and a light module printed circuit board.

SUMMARY

Lighting systems used in theaters or on concert stages typically include a plurality of light fixtures or lighting devices. Each light fixture includes a control printed circuit board connected to one or more light module printed circuit boards via physical wires. The presence of these connecting wires in the light fixture increases the size of the light fixture, increases the manufacturing complexity of the light fixture, and hinders the performance of the light fixture (e.g., reduced signal quality due to the length of the physical wires).

Embodiments described herein provide a light fixture for producing a light output. The light fixture includes a control printed circuit board and a light module printed circuit board. The control printed circuit board includes an aperture and a first number of printed circuit board layers. The control printed circuit board has a first surface area. The light module printed circuit board is configured to electrically connect to the control printed circuit board at the aperture to allow light from the light module printed circuit board to pass through the aperture. The light module printed circuit board includes a second number of printed circuit board layers. The light module printed circuit board has a second surface area. The first number of printed circuit board layers is greater than the second number of printed circuit board layers. The first surface area is larger than the second surface area.

Such a connection between the light module printed circuit board and the control printed circuit board enables the light module printed circuit board to be directly coupled to the control printed circuit board (e.g., via a plurality of conductive traces). As a result, wiring needed to electrically connect the light module printed circuit board to the control printed circuit board is reduced or eliminated. Additionally, manufacturing time is also reduced by reducing or eliminating the time required for wiring the light module printed circuit board to the control printed circuit board.

Additionally, due to the control printed circuit board having a first number of printed circuit board layers (e.g., a plurality of layers) and the light module printed circuit board having a second number of printed circuit board layers (e.g., a single layer), the thermal properties of the light module printed circuit board are at least maintained while the quality of the signals received from the control printed circuit board is improved. This is due to multiple layer printed circuit boards generally providing improved signal quality (e.g., due to better shielding) and single layer printed circuit boards generally having improved thermal properties. Signal quality is also improved by eliminating the physical wires between the light module printed circuit board and the control printed circuit board (i.e., by directly connecting the light module printed circuit board to the control printed circuit board).

Furthermore, the number of components disposed on the light module printed circuit board may be reduced. This is due to driver circuits and circuit routing being offloaded to the control printed circuit board as opposed to being disposed on the light module printed circuit board. For example, the light module printed circuit board does not include wire-to-board connectors, jumpers, or zero ohm resistors.

In some aspects, the light module printed circuit board is directly coupled to the control printed circuit board to allow light from the light module printed circuit board to pass through the aperture.

In some aspects, the light module printed circuit board is directly coupled to the control printed circuit board via a plurality of conductive traces.

In some aspects the second number of printed circuit board layers includes a single printed circuit board layer.

In some aspects, the light fixture further includes a driver circuit configured to drive one or more light sources located on the light module printed circuit board.

In some aspects, the driver circuit is located on the control printed circuit board.

In some aspects, the aperture is smaller than the second surface area of the light module printed circuit board.

In some aspects, the light module printed circuit board is manufactured from a material selected from the group consisting of: aluminum, copper, and ceramic.

In some aspects, the control printed circuit board is manufactured from epoxy resin.

In some aspects, the aperture is located at an edge of the control printed circuit board.

In some aspects, the aperture is square-shaped.

In some aspects, the aperture is circularly-shaped.

In some aspects, the light fixture further includes a second light module printed circuit board configured to electrically connect to the control printed circuit board at a second aperture, and the second light module printed circuit board includes the second number of printed circuit board layers.

In some aspects, the light module printed circuit board has the second surface area.

In some aspects, the aperture is located at an edge of the control printed circuit board.

In some aspects, the second aperture is located away from each edge of the control printed circuit board.

In some aspects, the light fixture further includes a first driver circuit configured to drive one or more light sources located on the light module printed circuit board, and a second driver circuit configured to drive one or more light sources located on the second light module printed circuit board.

In some aspects, the first driver circuit and the second driver circuit are each located on the control printed circuit board.

Before any embodiments are explained in detail, it is to be understood that the embodiments are not limited in its application to the details of the configuration and arrangement of components set forth in the following description or illustrated in the accompanying drawings. The embodiments are capable of being practiced or of being carried out in various ways. Also, it is to be understood that the phraseology and terminology used herein are for the purpose of description and should not be regarded as limiting. The use of "including," "comprising," or "having" and variations thereof are meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings.

In addition, it should be understood that embodiments may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic-based aspects may be implemented in software (e.g., stored on non-transitory computer-readable medium) executable by one or more processing units, such as a microprocessor and/or application specific integrated circuits ("ASICs"). As such, it should be noted that a plurality of hardware and software based devices, as well as a plurality of different structural components, may be utilized to implement the embodiments. For example, "servers" and "computing devices" described in the specification can include one or more processing units, one or more computer-readable medium modules, one or more input/output interfaces, and various connections (e.g., a system bus) connecting the components.

Other aspects of the embodiments will become apparent by consideration of the detailed description and accompanying drawings.

DETAILED DESCRIPTION

Embodiments described herein provide a light fixture including a control printed circuit board and one or more light module printed circuit boards. Each of the one or more light module printed circuit boards is directly connected to the control printed circuit board at an aperture of the control printed circuit board. Such a configuration allows light from the light module printed circuit board to pass through the aperture of the control printed circuit board.

Figure 1:
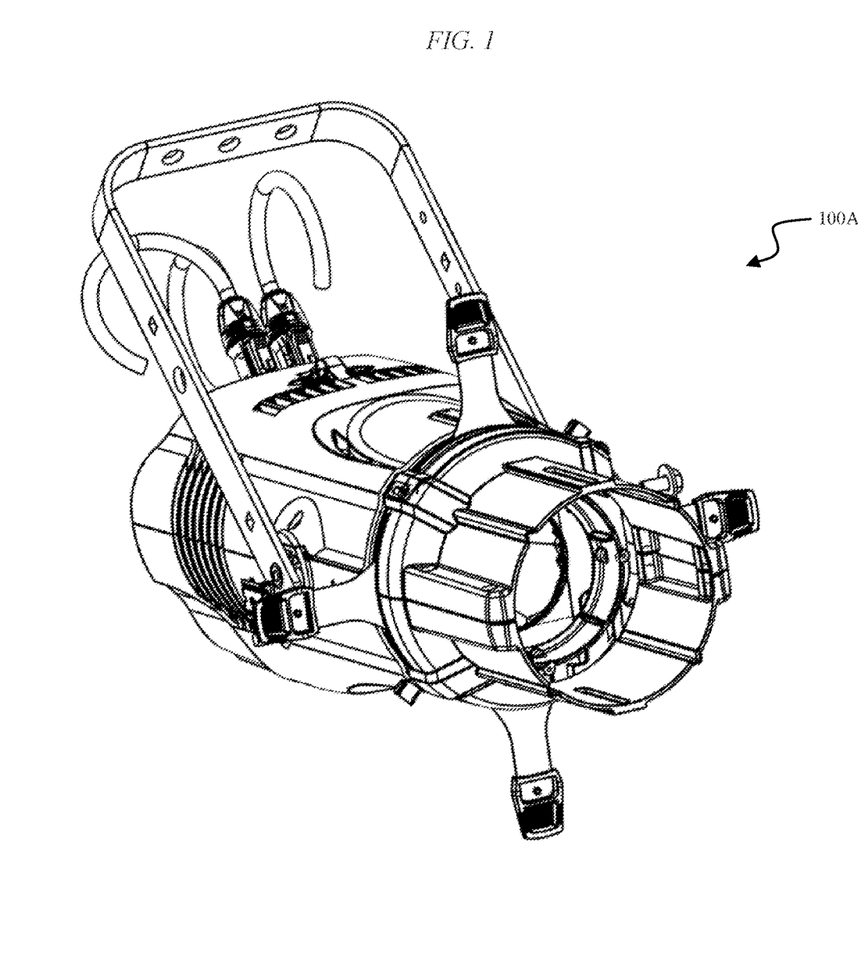
FIG. 1 is a perspective view of a first light fixture, according to embodiments described herein.

FIG. 1 illustrates a first light fixture 100A that includes a control printed circuit board and at least one light module printed circuit board. The first light fixture 100A is, for example, a profile light fixture, such as a Source Four LED light fixture manufactured and sold by Electronic Theatre Controls, Inc.

Figure 2:
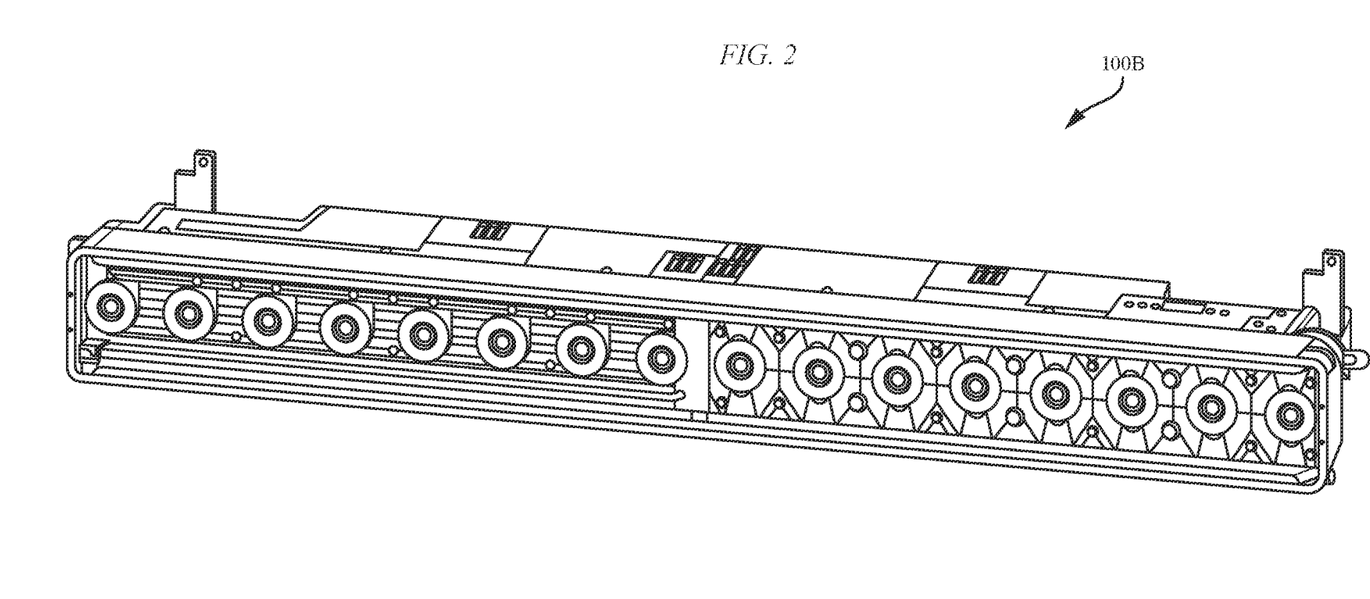
FIG. 2 is a perspective view of a second light fixture, according to embodiments described herein.

FIG. 2 illustrates a second light fixture 100B that includes a control printed circuit board and at least one light module printed circuit board. The second light fixture 100B is, for example, a wash light that includes a linear series of light sources or arrays of light sources, such as a ColorSource Linear light fixture manufactured and sold by Electronic Theatre Controls, Inc. The following description of the printed circuit boards in FIGS. 3-7 is applicable to either of the first and second printed circuit boards 100A, 100B.

Figure 3:
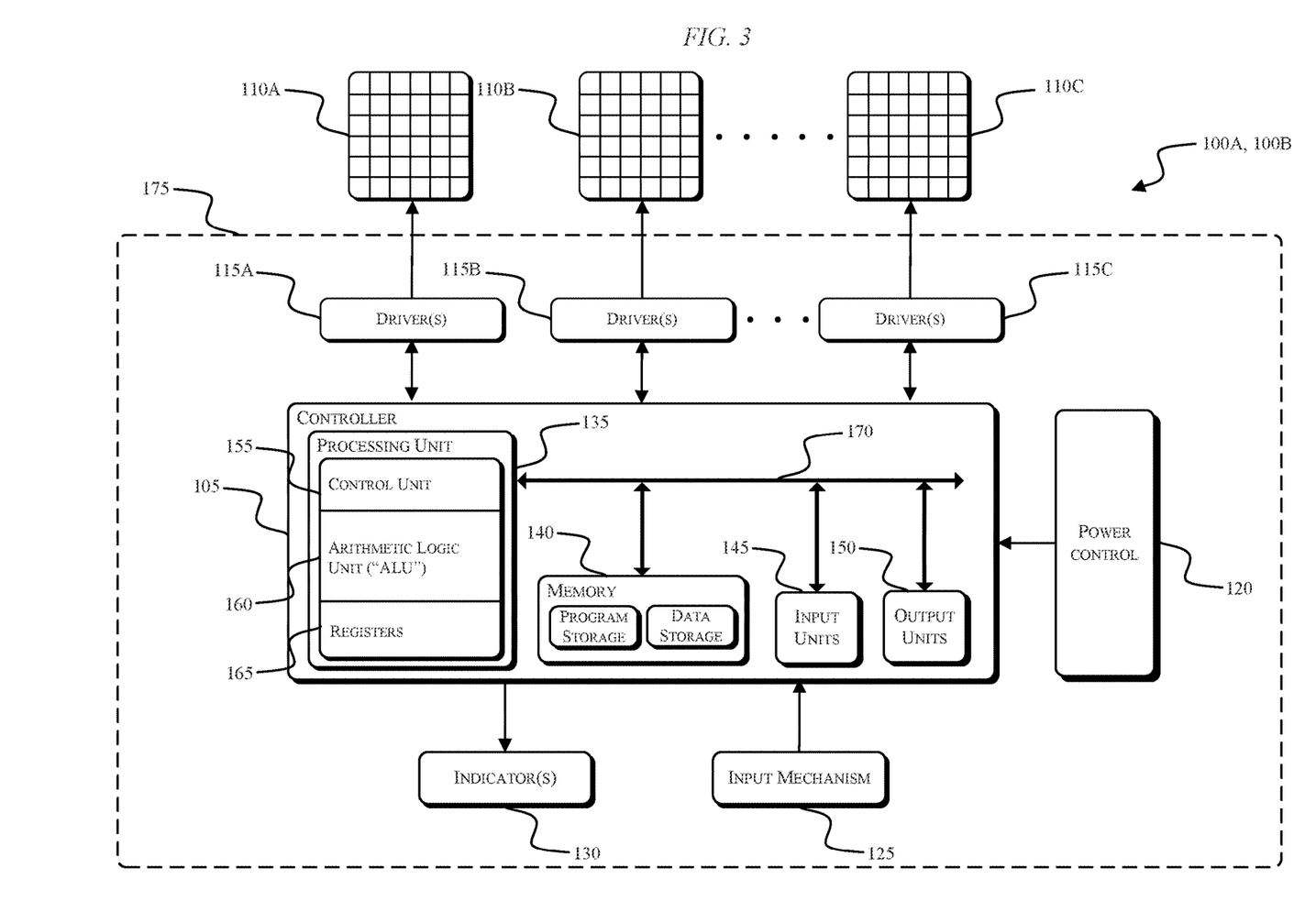
FIG. 3 is a block diagram of a control system for the light fixtures of FIG. 1 or FIG. 2 including a control printed circuit board and a plurality of light module printed circuit boards, according to embodiments described herein.
Figure 4A:
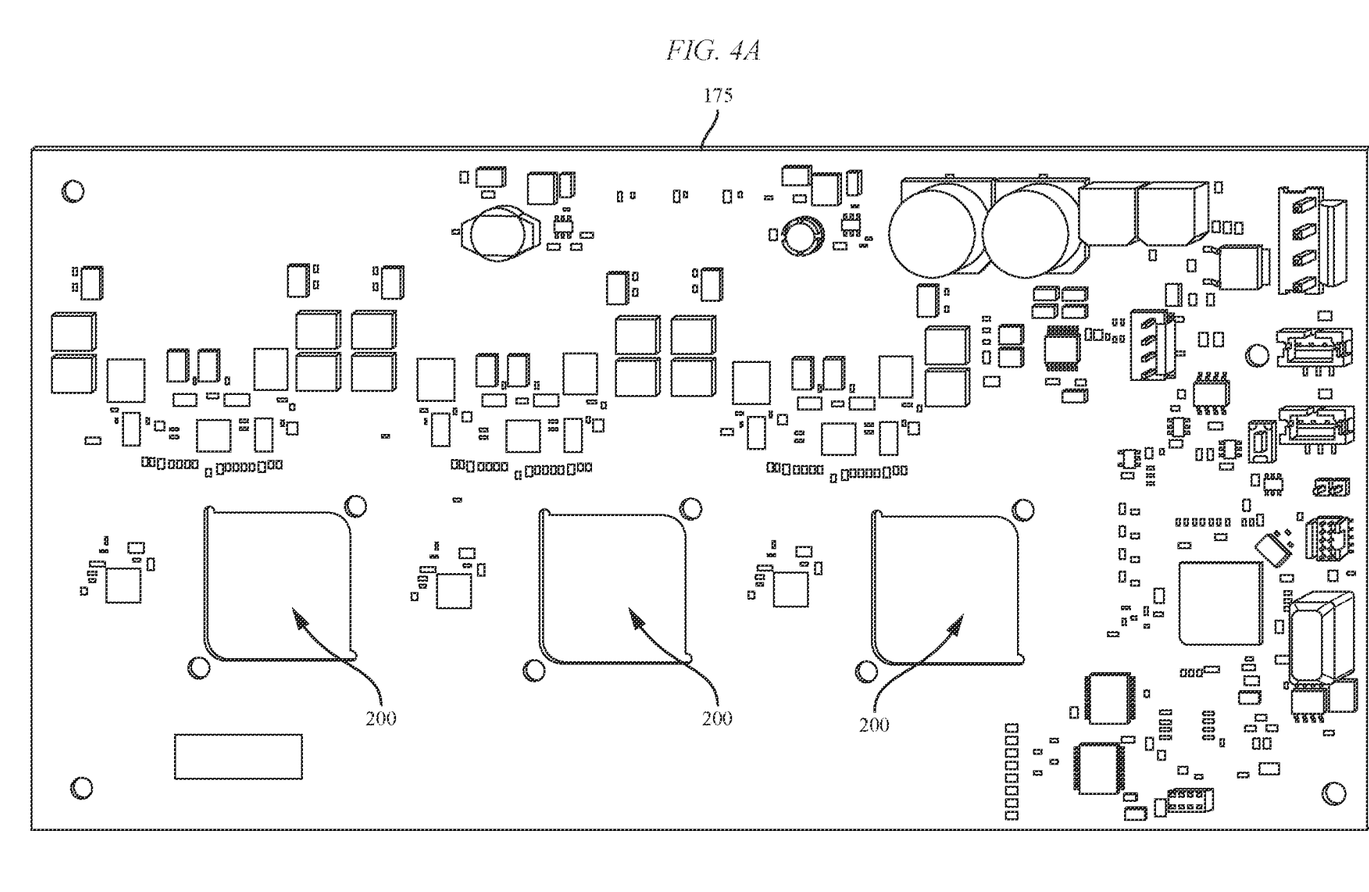
FIG. 4A is a top view of the control printed circuit board of FIG. 3, according to embodiments described herein.
Figure 4B:
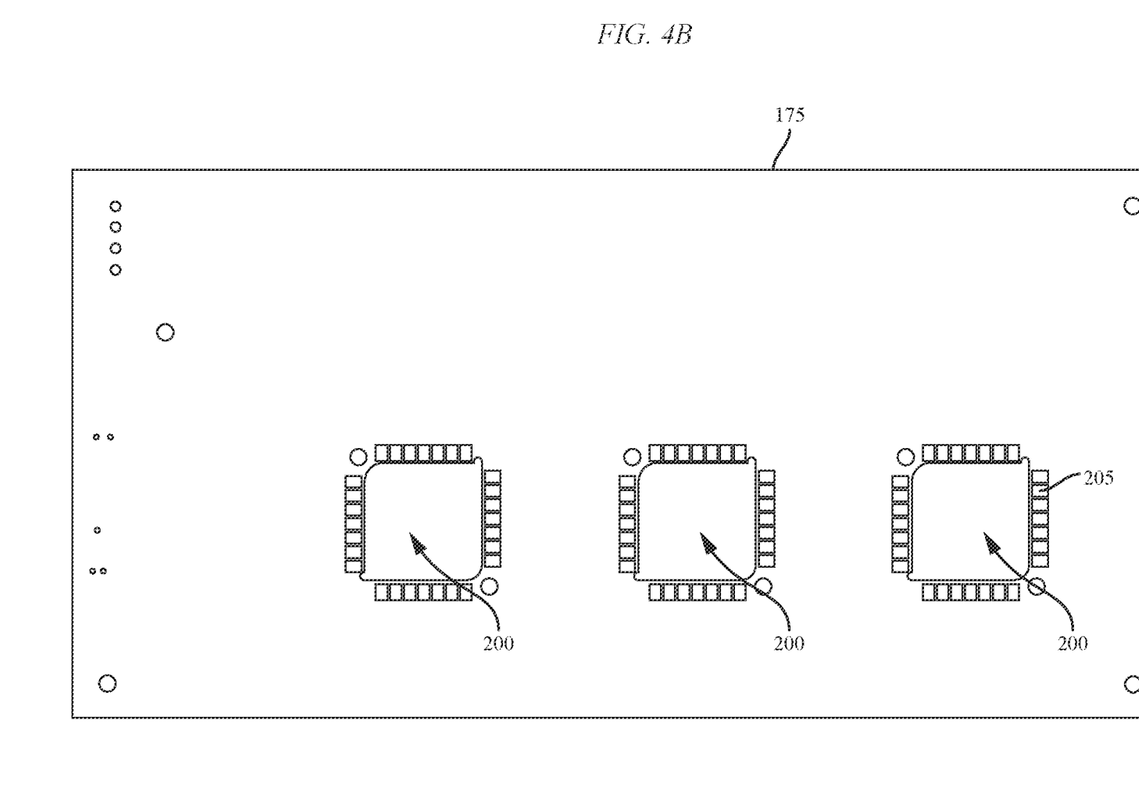
FIG. 4B is a bottom view of the control printed circuit board of FIG. 3, according to embodiments described herein

As illustrated in FIG. 3, the light fixture 100A, 100B includes a controller 105, a plurality of light modules or light module printed circuit boards 110A-110C, a plurality of driver circuits 115A-115C, a power control circuit 120, an input mechanism 125, and one or more indicators 130. The controller 105 includes a plurality of electrical and electronic components that provide power, operational control, and protection to the components and modules within the controller 105 and/or the fixture 100A, 100B. For example, the controller 105 includes, among other things, a processing unit 135 (e.g., a microprocessor, a microcontroller, or another suitable programmable device), a memory 140, input units 145, and output units 150. The processing unit 135 includes, among other things, a control unit 155, an arithmetic logic unit ("ALU") 160, and a plurality of registers 165 (shown as a group of registers in FIG. 3), and is implemented using a known computer architecture (e.g., a modified Harvard architecture, a von Neumann architecture, etc.). The processing unit 135, the memory 140, the input units 145, and the output units 150, as well as the various modules connected to the controller 105 are connected by one or more control and/or data buses (e.g., common bus 170). The use of one or more control and/or data buses for the interconnection between and communication among the various modules and components would be known to a person skilled in the art in view of the embodiments described herein. The control and/or data buses are shown generally in FIG. 3 for illustrative purposes.

The memory 140 is a non-transitory computer readable medium and includes, for example, a program storage area and a data storage area. The program storage area and the data storage area can include combinations of different types of memory, such as a ROM, a RAM (e.g., DRAM, SDRAM, etc.), EEPROM, flash memory, a hard disk, an SD card, or other suitable magnetic, optical, physical, or electronic memory devices. The processing unit 135 is connected to the memory 140 and executes software instructions that are capable of being stored in a RAM of the memory 140 (e.g., during execution), a ROM of the memory 140 (e.g., on a generally permanent basis), or another non-transitory computer readable medium such as another memory or a disc. Software included in the implementation of the light fixture 100A, 100B can be stored in the memory 140 of the controller 105. The software includes, for example, firmware, one or more applications, program data, filters, rules, one or more program modules, and other executable instructions. The controller 105 is configured to retrieve from the memory 140 and execute, among other things, instructions related to the control processes and methods described herein. In other embodiments, the controller 105 includes additional, fewer, or different components.

The driver circuits 115A-115C include a first driver circuit 115A, a second driver circuit 115B, and a third driver circuit 115C, operable to provide control signals to the light module printed circuit boards 110A-110C. For example, the first driver circuit 115A is connected to a first light module printed circuit board 110A for providing one or more drive signals to an array (i.e., one or more) light sources on the first light module printed circuit board 110A. The second driver circuit 115B is connected to a second light module printed circuit board 110B for providing one or more drive signals to an array (i.e., one or more) light sources on the second light module printed circuit board 110B. The third driver circuit 115C is connected to a third light module printed circuit board 110C for providing one or more drive signals to an array (i.e., one or more) light sources on the third light module printed circuit board 110C.

The power control circuit 120 supplies a nominal AC or DC voltage to the light fixture 100A, 100B. In some embodiments, the power control circuit 120 is powered by one or more batteries or battery packs. In other embodiments, the power control circuit 120 is powered by mains power having nominal line voltages between, for example, 100V and 240V AC and frequencies of approximately 50-60 Hz. The power control circuit 120 is also configured to supply lower voltages to operate circuits and components within the light fixture 100A, 100B.

As illustrated in FIG. 3, the controller 105 is connected to the three light module printed circuit boards 110A-110C. The respective arrays of light sources on each light module printed circuit boards 110A-110C can include multiple colors and zones for producing light. In some embodiments, the light fixture 100A, 100B includes four or more light module printed circuit boards. In other embodiments, the light fixture 100A, 100B includes fewer than three light module printed circuit boards (i.e., one or two light module printed circuit boards). In the illustrated embodiments, the light module printed circuit boards 110A-110C include arrays of light emitting diodes ("LEDs"). In other embodiments, different light sources are used.

As illustrated in FIG. 3, the controller 105, the plurality of driver circuits 115A-115C, the power control circuit 120, the input mechanism 125, and the one or more indicators 130 are all mounted on a control printed circuit board 175. The control printed circuit board 175 is electrically and/or physically connected to the light module printed circuit boards 110A-110C.

With reference to FIGS. 4A-8, the control printed circuit board 175 includes one or more apertures 200 extending through the control printed circuit board 175. In the illustrated embodiment, each aperture 200 is generally square in shape. In other embodiments, the apertures 200 may be circular, octagonal, or the like. As illustrated in FIG. 4B, each aperture 200 includes a plurality of conductive traces 205 for connecting to complementary traces on the light module printed circuit boards 110A-110C (see FIG. 5). The apertures 200 are disposed away from edges of the control printed circuit board 175. In some embodiments, one or more apertures 200 are positioned at or near one or more of the edges of the control printed circuit board 175 such that the apertures 200 are accessible from the edge (see FIG. 8). The number of apertures 200 corresponds to the number of light module printed circuit boards 110A-110C included in the fixture 100A, 100B. For example, in the depicted embodiment, three apertures 200 are provided in the control printed circuit board 175, with a light module printed circuit board 110A-110C being coupled to the control printed circuit board 175 at each of the apertures 200. In other embodiments, greater than or fewer than three apertures 200 are provided. Each aperture 200 is sized such that the aperture 200 is slightly smaller than the light module printed circuit board 110A-110C. The size of the apertures 200 allows the light module printed circuit boards 110A-110C to be coupled to the control printed circuit board 175 around the edges of the aperture 200 (e.g., at a lap joint).

Figure 5:
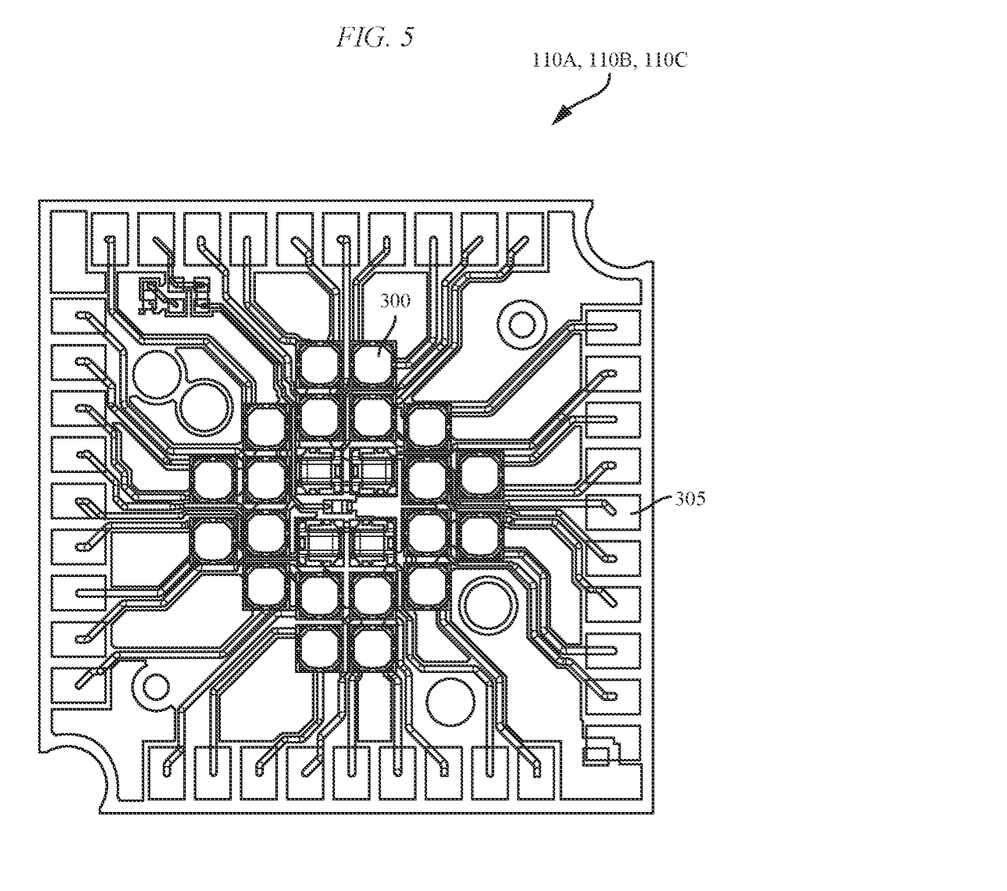
FIG. 5 is a top view of a light module printed circuit board of FIG. 3, according to embodiments described herein.

With reference to FIG. 5, the light module printed circuit boards 110A-110C include a plurality of light emitting diodes ("LEDs") 300 disposed on a surface of the light module printed circuit board 110A-110C. In other embodiments, a single LED, or an alternative light source, may be positioned on the light module printed circuit board 110A-110C. The LEDs 300 are positioned proximate to a center of the light module printed circuit board 110A-110C. In other embodiments, the LEDs 300 may be disposed at different locations on the light module printed circuit board 110A-110C. Each of the LEDs 300 is electrically connected to traces 305 positioned on an edge of the light module printed circuit board 110A-110C. For example, direct drive signals are provided to each of the LEDs 300 individually via two traces 305. In some embodiments, multiple LEDs 300 are coupled to the same traces 305. When the light module printed circuit board 110A-110C is coupled to the control printed circuit board 175, the traces 305 electrically connect the light module printed circuit board 110A-110C to the control printed circuit board 175. In some embodiments, the light module printed circuit board 110A-110C also includes a thermistor.

Figure 6:
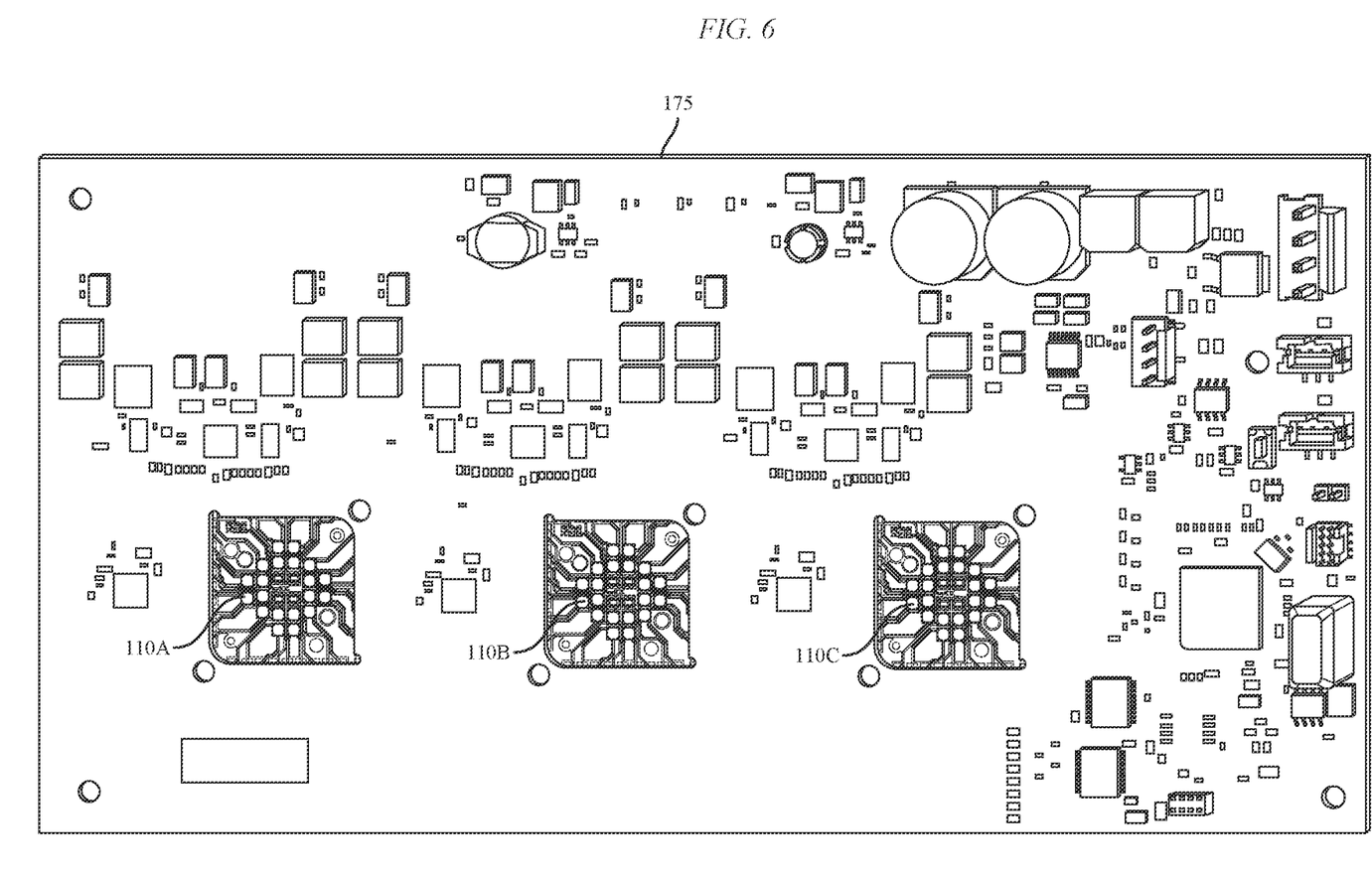
FIG. 6 is a top view of the control printed circuit board and the plurality of light module printed circuit boards of FIG. 3.

With reference to FIG. 6, the light module printed circuit boards 110A-110C are connected to the control printed circuit board 175 at the apertures 200 such that the LEDs 300 are positioned in the apertures 200 (see FIG. 7) and light emitted from the LEDs 300 passes through the apertures 200. The traces 305 at the edges of the light module printed circuit boards 110A-110C are electrically connected to a bottom of the control printed circuit board 175 using, for example, solder joints. The solder joints allow for a secure electrical connection between the control printed circuit board 175 and the traces 305 of the light module printed circuit board 110A-110C. In other embodiments, the traces 305 are coupled to the control printed circuit board 175 using different types of electrical connections (e.g., fusing).

Figure 7:
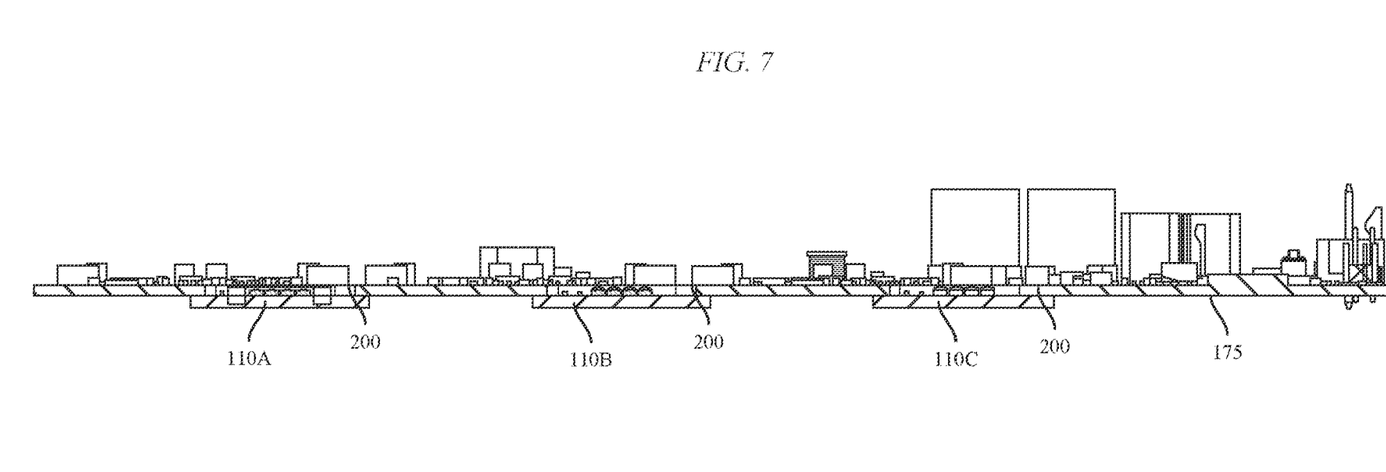
FIG. 7 is a cross-sectional side view of the control printed circuit board and the plurality of light module printed circuit boards of FIG. 6.
Figure 8:
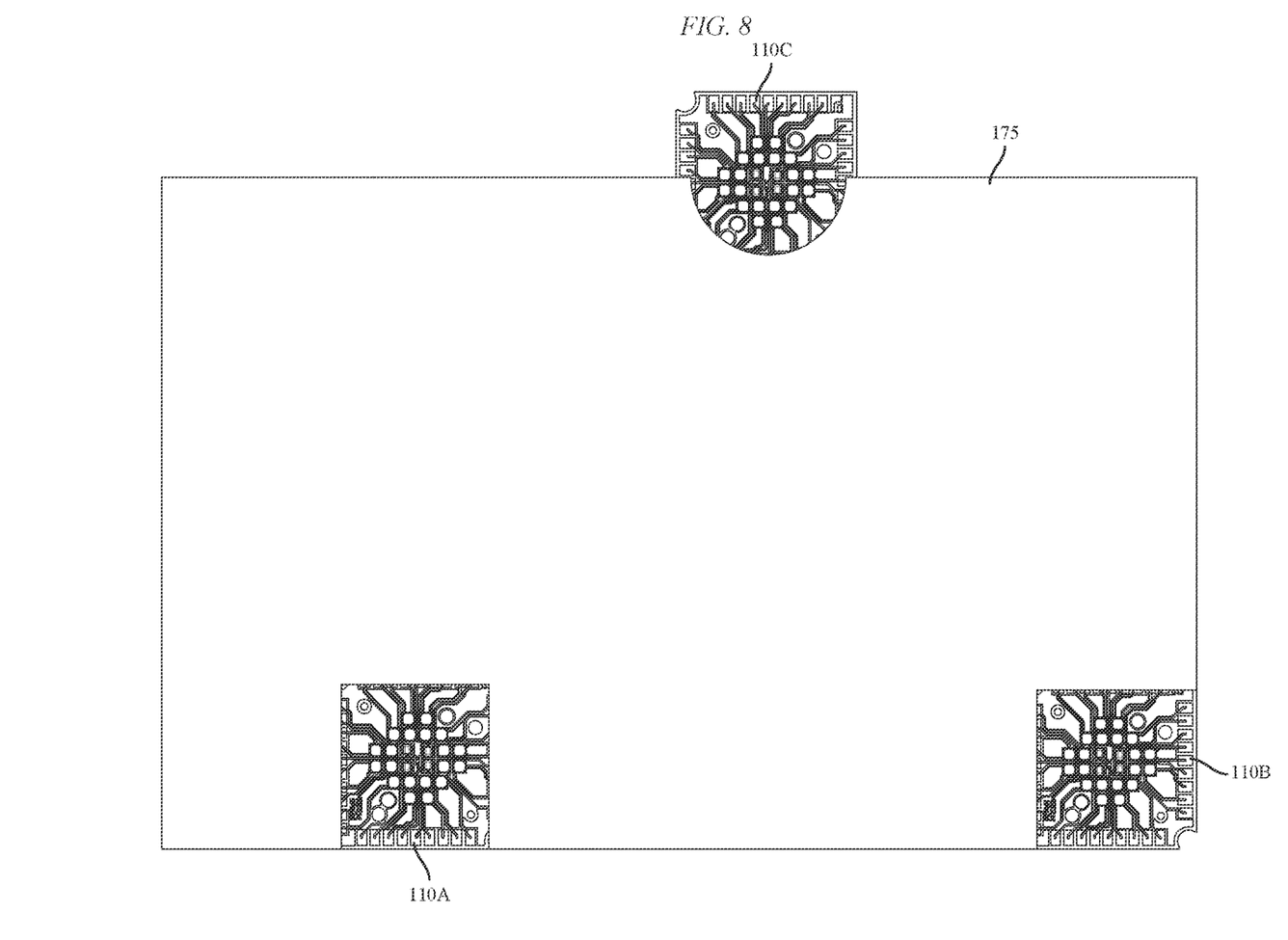
FIG. 8 is a top view of a control printed circuit board, according to embodiments described herein.

With reference to FIG. 7, the light module printed circuit boards 110A-110C have fewer circuit board layers than the number of circuit board layers included in the control printed circuit board 175. For example, in the illustrated embodiment, the light module printed circuit boards 110A-110C include a first number of printed circuit board layers (e.g., one layer) while the control printed circuit board 175 includes a second, greater number of printed circuit board layers (e.g., a plurality of layers). In other embodiments, the light module printed circuit boards 110A-110C include more than one layer. In some embodiments, the control printed circuit board 175 provides better shielding than the light module printed circuit boards 110A-110C, and, as a result, provides higher quality control signals to the light module printed circuit boards 110A-110C.

Additionally, the light module printed circuit boards 110A-110C define a first surface area that is smaller than a second surface area defined by the control printed circuit board 175. The surface areas are measured as the areas of a front face of the light module printed circuit boards 110A-110C and a front face of the control printed circuit board 175, respectively. By offloading, for example, the driver circuits 115A-115C from the light module printed circuit boards 110A-110C to the control printed circuit board 175, the light module printed circuit boards 110A-110C can be made smaller. As a result, the density of the light module printed circuit boards 110A-110C (i.e., density of traces 305 in FIG. 5) is increased.

In some embodiments, the light module printed circuit boards 110A-110C are manufactured from aluminum, copper, ceramic, or another similar material. Such materials provide improved heat transfer characteristics when compared to, for example, epoxy resin printed circuit boards. In some embodiments, the control printed circuit board 175 is manufactured from epoxy resin or another similar material. In other embodiments, the light module printed circuit boards 110A-110C and the control printed circuit board 175 are manufactured from other materials.

Thus, embodiments described herein provide, among other things, a light fixture that includes a control printed circuit board having an aperture at which a light module printed circuit board is attached. Various features and advantages are set forth in the following claims.

What is claimed is:

1. A light fixture for producing a light output, the light fixture comprising:
a control printed circuit board including an aperture and a first number of printed circuit board layers, the control printed circuit board having a first surface area; and
a light module printed circuit board configured to electrically connect to the control printed circuit board at the aperture, the light module printed circuit board including a second number of printed circuit board layers, the light module printed circuit board having a second surface area, the light module printed circuit board including a plurality of light emitting diodes ("LEDs") and a plurality of conductive traces, the light module printed circuit board configured to be directly coupled to the control printed circuit board via the plurality of conductive traces such that the plurality of LEDs is positioned in the aperture to allow light from the plurality of LEDs to pass through the aperture,
wherein each of the plurality of LEDs is electrically connected to respective first and second conductive traces of the plurality of conductive traces and the respective first and second conductive traces of the plurality of conductive traces are electrically connected to first and second complementary conductive traces on the control printed circuit board,
wherein the first number of printed circuit board layers is greater than the second number of printed circuit board layers, and
wherein the first surface area is larger than the second surface area.

2. The light fixture of claim 1, wherein each of the plurality of conductive traces is positioned on an edge of the light module printed circuit board.

3. The light fixture of claim 1, wherein the second number of printed circuit board layers includes a single printed circuit board layer.

4. The light fixture of claim 1, further comprising a driver circuit configured to drive the plurality of LEDs located on the light module printed circuit board.

5. The light fixture of claim 4, wherein the driver circuit is located on the control printed circuit board.

6. The light fixture of claim 1, wherein the aperture is smaller than the second surface area of the light module printed circuit board.

7. The light fixture of claim 1, wherein the light module printed circuit board is manufactured from a material selected from the group consisting of: aluminum, copper, and ceramic.

8. The light fixture of claim 7, wherein the control printed circuit board is manufactured from epoxy resin.

9. The light fixture of claim 1, wherein the aperture is located at an edge of the control printed circuit board.

10. The light fixture of claim 1, wherein the aperture is square-shaped.

11. The light fixture of claim 1, wherein the aperture is circularly-shaped.

12. The light fixture of claim 1, further comprising:
a second light module printed circuit board configured to electrically connect to the control printed circuit board at a second aperture, the second light module printed circuit board including the second number of printed circuit board layers.

13. The light fixture of claim 12, wherein the second light module printed circuit board has the second surface area.

14. The light fixture of claim 12, wherein the aperture is located at an edge of the control printed circuit board.

15. The light fixture of claim 14, wherein the second aperture is located away from each edge of the control printed circuit board.

16. The light fixture of claim 12, wherein the aperture is square-shaped.

17. The light fixture of claim 12, wherein the aperture is circularly-shaped.

18. The light fixture of claim 12, further comprising:
a first driver circuit configured to drive the plurality of LEDs located on the light module printed circuit board; and
a second driver circuit configured to drive a second plurality of LEDs located on the second light module printed circuit board.

19. The light fixture of claim 18, wherein the first driver circuit and the second driver circuit are each located on the control printed circuit board.

\* \* \* \* \*